(12) United States Patent
Bareket et al.

(10) Patent No.: US 7,897,942 B1
(45) Date of Patent: Mar. 1, 2011

(54) DYNAMIC TRACKING OF WAFER MOTION AND DISTORTION DURING LITHOGRAPHY

(75) Inventors: Noah Bareket, Saratoga, CA (US); Marek Zywno, San Jose, CA (US)

(73) Assignee: KLA-Tencor Corporation, San Jose, CA (US)

( * ) Notice: Subject to any disclaimer, the term of this patent is extended or adjusted under 35 U.S.C. 154(b) by 202 days.

(21) Appl. No.: 12/335,736

(22) Filed: Dec. 16, 2008

Related U.S. Application Data

(60) Provisional application No. 61/015,614, filed on Dec. 20, 2007.

(51) Int. Cl.
*G03B 27/62* (2006.01)

(52) U.S. Cl. ............................. 250/492.2; 250/492.22; 250/398

(58) Field of Classification Search ............... 250/492.2, 250/492.22, 492.23, 398; 355/52, 53, 71
See application file for complete search history.

(56) References Cited

U.S. PATENT DOCUMENTS

| | | | |
|---|---|---|---|
| 5,641,960 | A | 6/1997 | Okubo et al. |
| 6,304,320 | B1 | 10/2001 | Tanaka et al. .................. 355/73 |
| 6,515,742 | B1 | 2/2003 | Ruprecht |
| 6,522,386 | B1 * | 2/2003 | Nishi ........................... 355/52 |
| 6,552,773 | B2 | 4/2003 | Emoto |
| 7,288,859 | B2 | 10/2007 | Hazelton ...................... 310/12 |
| 7,289,868 | B2 * | 10/2007 | Picciotto et al. ............. 700/121 |
| 2002/0047542 | A1 | 4/2002 | Higuchi |
| 2002/0171815 | A1 * | 11/2002 | Matsuyama et al. ........... 355/55 |
| 2003/0230323 | A1 | 12/2003 | You et al. |
| 2005/0092013 | A1 | 5/2005 | Emoto |
| 2006/0054494 | A1 | 3/2006 | Reiss |
| 2008/0142733 | A1 | 6/2008 | Zywno |

FOREIGN PATENT DOCUMENTS

| | | |
|---|---|---|
| WO | WO 9715978 | 5/1997 |
| WO | WO 2005078526 | 8/2005 |
| WO | WO 2006007167 | 1/2006 |

OTHER PUBLICATIONS

Office Action for U.S. Appl. No. 11/670,896 dated Mar. 9, 2009.
International Search Report and Written Opinion of the International Searching Authority—dated Sep. 23, 2008—International Patent Application No. PCT/US07/87953.

(Continued)

*Primary Examiner*—Kiet T Nguyen
(74) *Attorney, Agent, or Firm*—Joshua D. Isenberg; JDI Patent (57) ABSTRACT

A substrate processing apparatus and method for dynamic tracking of wafer motion and distortion during lithography are disclosed. An energetic beam may be applied to a portion of a substrate according to a predetermined pattern. The relative positions of one or more targets on the substrate may be determined while applying the energetic beam to the portion of the substrate. A dynamic distortion of the substrate may be determined from the relative positions while applying the energetic beam to the portion of the substrate. Application of the energetic beam may be deviated from the predetermined pattern in a manner calculated to compensate for the dynamic distortion of the substrate.

28 Claims, 8 Drawing Sheets

OTHER PUBLICATIONS

U.S. Appl. No. 60/870,528, to Marek Zywno et al., entitled "Substrate Processing Apparatus and Method" filed Dec. 18, 2006.
U.S. Appl. No. 11/532,748 to Yehiel Gotkis et al., entitled "Temperature Stabilization for Substrate Processing" filed Sep. 18, 2006.
U.S. Appl. No. 60/948,667, to Marek Zywno et al., entitled "Substrate Processing Apparatus and Method" filed Jul. 9, 2007.
U.S. Appl. No. 12/170,361 to to Marek Zywno et al., entitled "Substrate Processing Apparatus and Method" filed Jul. 9, 2008.
U.S. Appl. No. 61/016,614, to Noah Bareket et al., entitled "Dynamic Tracking of Wafer Motion and Distortion During Lithography" filed Dec. 20, 2007.

* cited by examiner

DYNAMIC TRACKING OF WAFER MOTION AND DISTORTION DURING LITHOGRAPHY

CLAIM OF PRIORITY

This application claims the benefit of priority of commonly-assigned co-pending U.S. Provisional Patent Application No. 61/015,614, filed Dec. 20, 2007, the entire contents of which are incorporated herein by reference.

FIELD OF THE INVENTION

This invention generally relates to substrate inspection and lithography and more particularly to substrate processing apparatus used in substrate inspection and lithography.

BACKGROUND OF THE INVENTION

Semiconductor fabrication uses a process known as lithography to form sub-micron features on a substrate. One type of lithography known as photolithography is based on exposure of a photosensitive resist to light radiation that is focused through a patterned mask. A layer of the resist material is formed on a semiconductor wafer. The radiation is focused on the surface of the resist to project the mask pattern onto the resist. Portions of the resist that are exposed to the radiation are altered in a way that either makes them susceptible to removal (in the case of a positive resist) or resistant to removal (in the case of a negative resist). Developing the resist transfers the mask pattern to the resist and allows a pattern of material to be removed from or deposited on the substrate through a pattern of openings in the resist.

Another type of lithography referred to as direct-write lithography uses a narrow energetic beam such as a laser beam or a beam of electrons. The beam shines on the resist while the wafer moves relative to the plane of incidence of the beam. As the wafer moves, the beam is turned on and off to expose the resist in a predetermined pattern.

Lithography systems used in semiconductor manufacturing often include a system of sensors and associated electronics and software to sense wafer position during lithography. Such systems are ultimately responsible for maintaining the registration of the printed pattern with respect to the wafer during lithography. In prior art lithography systems a wafer is typically aligned before the exposure process starts. The process relies on maintaining the pre-exposure alignment through the completion of the exposure process by means of precision control of a stage to which the wafer is mounted. Such systems can account for deviation of the pattern registration with counteracting rigid body motions of the stage. Unfortunately, a wafer on the stage may move with respect to the stage during the exposure process. Furthermore, the wafer may be subject to distortions in its shape during the exposure process. Both of these are not taken into account by prior art wafer alignment systems.

Prior art wafer alignment systems may take rigid body motions of the wafer into account, e.g., by solidly attaching the wafer to the stage. Prior art lithography systems may also rely on field by field alignment (mapping) before the exposure process to map wafer distortions. Such field-by-field mapping takes into account wafer distortion when the wafer motion (i.e., the stage motion) is stopped. However, field-by-field alignment does not take into account distortions occurring during movement of the wafer as the exposure takes place.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

A recent development in lithography is the use of high-speed electron beam writing. Examples of high-speed electron beam lithography systems and methods are described, e.g., in commonly-assigned U.S. patent application Ser. No. 11/670,896 to Marek Zywno and Noah Bareket, which was filed on Feb. 2, 2007, the disclosures of which are incorporated herein by reference. In such systems, multiple wafers may be spun by a rotating stage relative to an electron beam. The rotary stage translates with respect to the beam as it spins. The result is a spiral beam writing path similar to the path of a phonograph needle along a phonograph record. Such a system allows for very high writing speeds and therefore high throughput of wafers. Unfortunately, such high-speed writing also produces high accelerations and mechanical forces that may distort the wafer during writing. Such rotating systems often operate in vacuum, necessitating the use of electrostatic chucks to retain the wafers. Electrostatics chucks are somewhat limited in the size of chucking force that they can apply. Thus wafers are more susceptible to movement relative to the stage. Furthermore, each wafer may butt up against a fence to keep the wafer from flying off the stage as the stage rotates. The force exerted by the fence on the wafer can lead to wafer distortion.

In addition to distortion due to mechanical stress, wafers may also be subject to distortion due to thermal stress as a result of energy deposited on the wafers by the electron beam during the exposure process. Such thermal stresses may occur globally across a wafer as the average wafer temperature rises. In addition, there may be thermal gradients in the vicinity of the electron beam that cause localized distortions Prior art systems have not had to take such dynamic distortions into account since these distortions were relatively small. However, as feature sizes shrink and wafer distorting forces increase dynamic distortions may become so large that they must be tracked dynamically in order to take them into account during the writing process.

Therefore, in embodiments of the present invention distortions of a substrate are tracked continuously during lithography over a time scale that is within the bandwidth of the distortions. The bandwidth is defined by the frequency of the variation of surface distortion in space and in time. The bandwidth increases as the scan speed increases. Generally, the distortions are tracked over a time scale that is shorter than a time scale associated with the rate of change of the distortions. Distortion measurements may be sampled at intervals that are sufficient to drive a control system with the required bandwidth. Corrective action may then be taken based on a time-dependent understanding of the wafer distortion.

Figure 1A:
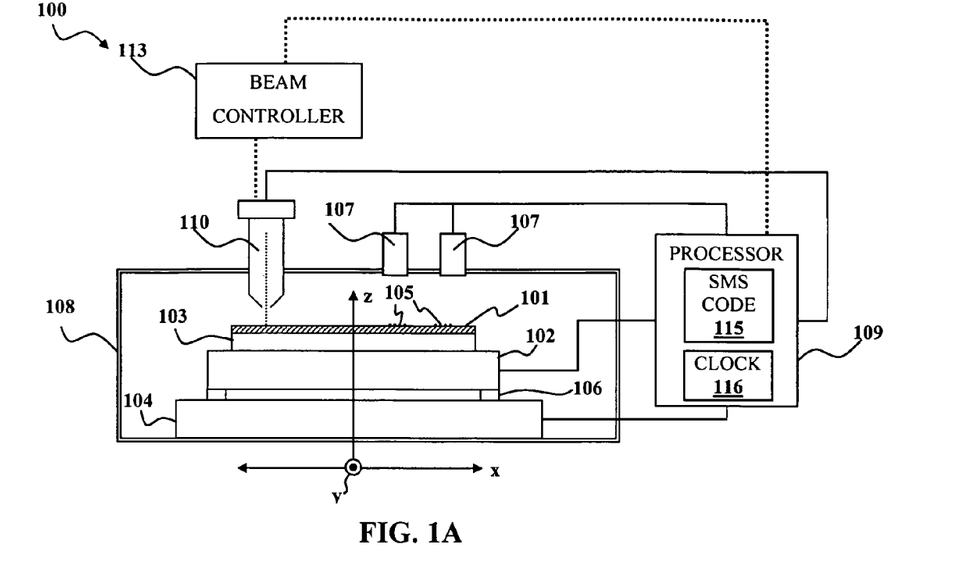
FIG. 1A is a schematic diagram of substrate processing apparatus according to an embodiment of the present invention.

A substrate processing apparatus 100 according to an embodiment of the present invention is depicted schematically in FIG. 1A. The apparatus 100 generally includes a first stage 102 and a second stage 104. The first stage 102 carries one or more substrate chucks 103. Each substrate chuck 103 is adapted to support and retain a substrate 101. Examples of suitable substrates include, but are not limited to, semiconductor wafers, or reticles for optical lithography.

The first stage 102 is configured to move with respect to the second stage 104 and the second stage 104 is configured to move with respect to some fixed frame of reference. In some embodiments, the first and second stages may be linear stages configured for X-Y translation. Alternatively, the first stage 102 may be a rotary stage that rotates about a z axis and the second stage 104 may be a translating stage moves the first stage 102 linearly in a direction parallel to the plane of rotation of the first stage 102. One or more bearings may support the first stage 102, facilitate smooth movement of the first stage 102 and transfer translation forces between the rotary stage 102 and the translating stage 104 in such a way as to maintain the z axis of the first stage 102 in a substantially fixed position and orientation relative to the translating stage 104 as the translating stage moves with respect to a support structure 108. By way of example, the support structure 108 may be a vacuum chamber, the lid of the vacuum chamber, or a stage base structure.

By way of example, the first stage 102 and second stage 104 may be disposed within a chamber, e.g., a vacuum chamber, to provide a controlled environment for processing the substrate 101 and serves as the support structure 108. A substrate processing tool 110 may be used to apply an energetic beam to selected portions of the substrate 101 according to a predetermined pattern with radiation, e.g., in the form of electromagnetic radiation, such as infrared, visible or ultraviolet light, or in the form of a beam of charged particles, such as electrons or ions. The processing tool 110 may be part of a lithographic system, e.g. an electron beam exposure column or an optical lithography lens system. Alternatively, the tool 110 may be part of a substrate metrology or inspection tool that exposes selected portions of the substrate 101 to radiation and collects scattered or secondary radiation from the substrate 101. Examples of such tools include optical wafer inspection tools and scanning electron microscopes.

In the case of any X-Y stage, a combination of translational motion of the first stage along a first axis and translational motion of the second stage along a second axis allows the tool 110 to process an entire surface of the substrate 101. In the case of a rotary-linear stage, a combination of rotary motion of the first stage 102 and linear motion of the second stage 104 may move the substrate 101 relative to the tool 110 in such a way that the optical column may probe the entire surface of the substrate 101 in a continuous fashion e.g., along a spiral path. Such motion is analogous to the movement of a phonograph needle relative to a record or a laser beam relative to a compact disc (CD). It is noted that in some embodiments, the optical column may similarly probe the substrate 101 along a spiral path if the tool 110 is made to move in a linear fashion relative to the first stage 102 as the first stage 102 spins about its axis.

An advantage of rotary-linear stages is that, unlike reciprocating motion or R-θ motion of conventional non-continuous R-θ positioning stages, continuous rotary motion, tends to be inherently smooth. The inertial forces of the rotary stage are inherently balanced, and gyroscopic effects tend to stabilize the orientation of the rotation axis z. Consequently, an apparatus 100 based upon a rotary-linear stage may scan large substrates quickly without having to impart high acceleration to the substrate 101. In alternative embodiments the tool may probe the surface of the substrate 101 with continuous rotary motion along a series of concentric circular paths having different radii. In such a case, the rotary motion may be kept continuous while the linear motion is discontinuous.

In multiple substrate rotary-linear stage configurations, multiple chucks may be arranged symmetrically on a rotating platter that forms the first stage 102. The layout of the chucks 103 on the first stage 102 can be in a single radial arrangement, with all chucks 103 arranged at the same radial distance from the z axis. Alternatively, the chucks 103 may be arranged in multiple rows, a hexagonal pack, or another arrangement suitable for writing or probing of the substrates. Corresponding data path strategies would follow the substrate layout.

The apparatus 100 may be equipped with a substrate metrology system SMS having one or more target sensors 107 allowing for feedback on dynamic wafer distortions. The target sensor 107 is configured to generate time-dependent signals related to positions of reference targets 105 on the substrate 101. In some embodiments, the chuck 103 may include sensors that allow measurement of parameters important to accurate writing, for example thermal sensors, e-beam detectors, e-beam reflectors or position sensors.

The substrate processing apparatus 100 also includes a processor 109 and a beam controller 113. The processor 109 operably coupled to the target sensors 107, which measure the relative positions of the targets 105 while the beam source 110 applies the energetic beam to the portion of the substrate 101. The processor 109 employs software and algorithms that determine a dynamic distortion of the substrate 101. The SMS may include software code 115 running on the processor 109 and a master clock 116 to keep track of the relative timing of signals from the sensors 107. The beam controller 113 is operably coupled to the processor 109 and the tool 110 to control the stage motion and position, and also deviate application of the energetic beam from the predetermined pattern in a manner calculated to compensate for the dynamic distortion of the substrate.

It is noted that in some embodiments, the tool 110 may produce a pattern of radiation on the substrate 101 by focusing the radiation through a patterned mask to form an image of the pattern on the substrate. The program code 115 may be configured to implement a process control loop in which stress and/or shape metrology data, acquired at a high spatial density from the targets 105 across the substrate 101 may be used to calculate corrections to the process implemented by the tool 110 by various modeling methods. Such corrections may subsequently be used to implement focus and image positioning corrections to the patterning process. In this way, the patterning process may compensate for deformations induced in process steps prior to patterning. This is different from the existing state of the art, since in current patterning tools, there are severe constraints on the time available to perform metrology activities on the wafer in preparation for the patterning step. Due to these time constraints, in situ-metrology does not currently perform high density sampling of stress and deformation metrology, in order to enable high order focus and other compensation during the subsequent patterning step.

Figure 1B:
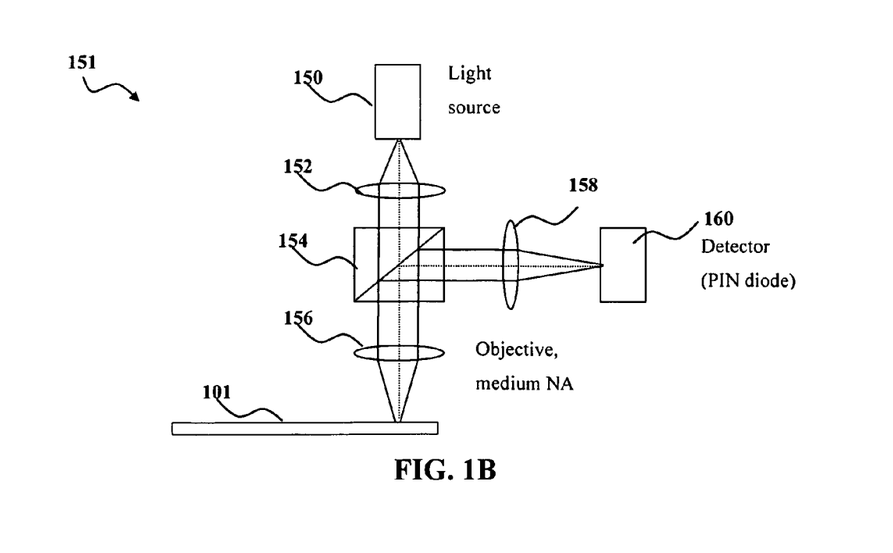
FIG. 1B is a schematic diagram of a scanning microscope sensor head that may be used as a wafer position sensor in the apparatus of FIG. 1A.

FIG. 1B is a schematic diagram of a scanning microscope sensor head 151 that may be used as a wafer position sensor and or wafer distortion sensor for a substrate metrology system (SMS) in the apparatus of FIG. 1A. The sensor head 151 is an optical sensor that measures the position of the targets 105 during acquisition and tracking. The SMS may be made of multiple sensor heads. The scanning laser microscope sensor head 151 is used to detect signals that come from grating targets 105. This concept makes use of the high speed wafer motion to provide the scanning, and no image stabilization, TDI or moving optics is thus required. As shown in FIG. 1B, a simple sensor head 151 includes a laser source 150, optical lenses 152, 156 and 158, beam splitter 154 and a detector 160. The scanning microscope sensor head preferably includes two or more laser sources at different wavelength to ensure minimal diffraction efficiency from the grating targets. The scanning microscope sensor head requires dynamic focusing as focus errors translate to position errors due to parallax and other effects.

Figure 1C:
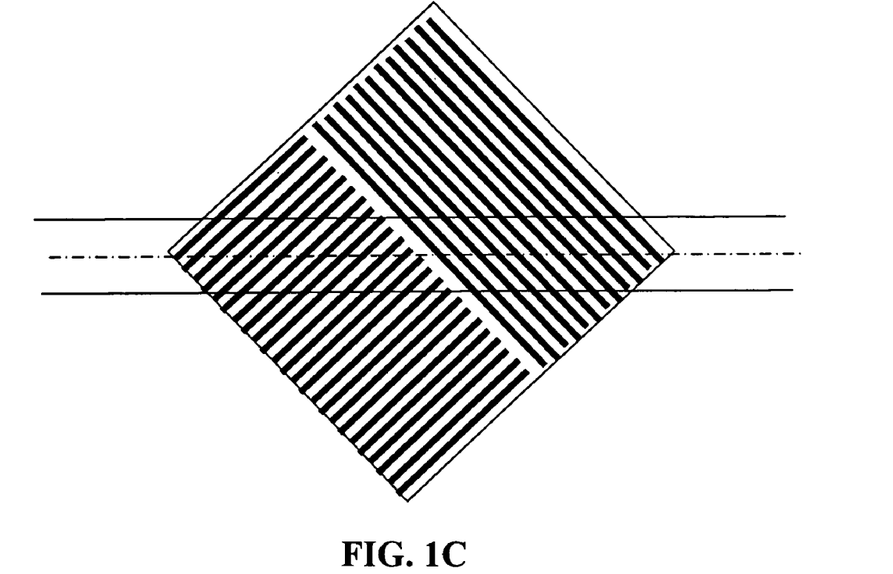
FIG. 1C is a schematic diagram of an alignment and registration pattern, illustrating scan direction and capture range with a grating target and a wafer position sensor of the type shown in FIG. 1B.

An example of a grating target that can be used in conjunction with the scanning laser microscope is shown in FIG. 1C. By way of example, a signal that is created as the microscope scans the grating is a short burst in the form of what is ideally a pure sinusoid. Measuring the target position may be accomplished by determining a phase of the signal relative to a reference, which may be a master clock for the apparatus 100. There are several algorithms for establishing the phase, including correlation algorithms, curve fitting, n-point discrete algorithms, and the like, which may be used to determine the phase. If the phase is typically measured modulo one cycle, the gross position of the targets may be estimated by an envelope fit. The sinusoidal signal frequency may be also measured to high accuracy, determined by the target mark fidelity, and may provide a measurement of the stage velocity.

Since the target is scanned only in one direction, it will need to be rotated at some angle with respect to the scan direction, e.g., 45 degrees, so that both axes may be measured. This may be accomplished relatively easily, e.g., by positioning the wafer on the stage at an angle that presents the targets to the sensor at a nominally 45 degrees to the tangential motion. Since the scan is not purely linear but has a rotational element to it, the measurement algorithm may have to make an appropriate correction. Such a correction may be a function of the target location on the wafer. FIG. 1C illustrates the scan direction and scan capture range that enables sensing both axis of the target position.

As may be seen from FIG. 1C the capture range is typically a small portion of the available target. A variant of the baseline concept illustrated in FIG. 1C may use two beams, focused a short distance apart, to cover a larger number of grating lines.

The SMS may require multiple sensor heads to provide adequate spatial and temporal sampling. The optimum distribution of the sensor heads may be subject to design tradeoffs that take into account the control system requirements for sampling frequency and the stage design. There are two basic approaches for positioning the sensors. In a first approach, the sensors are distributed around the stage. In a second approach, the sensors are clustered near the writing point. The first approach requires the sensors to have at least one axis of motion to track the stage and the targets. This approach has the advantage of providing optimal coverage of the wafer and requires the smallest number of sensors as they can be moved to intercept the alignment marks at fixed intervals. The second approach is attractive because it enables the sensors to be rigidly attached to the apparatus 186 used for beam writing or inspection, which may simplify the mechanical and control complexity. Since the stationary sensors tend to intercept the alignment marks in unequal intervals, an increase in the number of sensor heads may be needed.

Figure 1D:
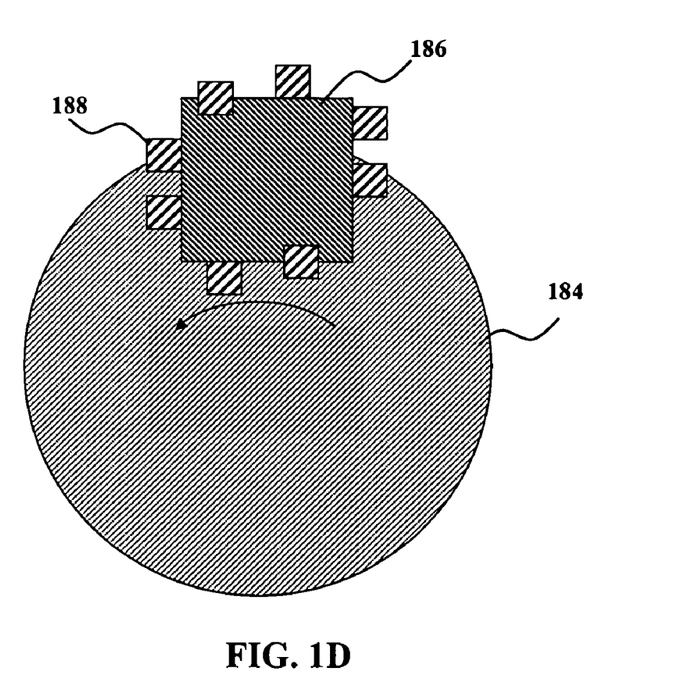
FIG. 1D is a schematic diagram illustrating an example of a possible sensor head distribution for a substrate processing apparatus according to an embodiment of the present invention.

According to one embodiment, a baseline architecture may employ a plurality of stationary sensors. By way of example, and without loss of generality, about 4 to 8 sensors may be needed to provide a sufficient sampling rate, e.g., a few hundred samples per second. An example of a possible arrangement of 8 sensors is shown in FIG. 1D. As shown in FIG. 1D, 8 sensors 188 may be stacked on the inspection or writing apparatus 186 used for scanning or writing on wafer 184. The sensors are staggered for maximum coverage, some are leading and some are trailing the scan directions, enabling area coverage around the writing point. The area coverage is required for reconstruction of the wafer distortion.

The SMS measurement may be based on timing of signals, and in such a case the master clock may be used as an ultimate metrology reference. It is often desirable, however, to translate the timing measurement into position measurement. This may be accomplished by referencing the wafer coordinates to the stage coordinates via reference targets on the stage. These targets may be positioned on spokes between wafers and constructed as continuous rulers, similar to optical encoder rulers. The SMS may sample the reference targets as the stage moves past the sensors. In addition, these rulers may also include high contrast e-beam targets and provide a direct reference to the beam position. By this method, a direct measurement of the wafer target position relative to the writing beam is obtained.

Embodiments of the present invention may utilize a control strategy in which dynamic registration of the writing beam is accomplished by controlling two subsystems: the stage and the beam. A large difference in the response time of the two subsystems may create a natural hierarchy of the control response. Specifically, the stage may correct for slow and large position errors, while the agile beam positioning may be used to correct fast, low amplitude errors. The position (or velocity) sensors may be distributed, some measuring the stage while others, e.g. the SMS, may measure the wafer or beam position. An integrated control system may use inputs from all the sensors to issue control commands to both the stage and the beam. This is a significant point that impacts the design of SMS. For example, in the case of a rotary-linear stage it may be desirable for the SMS to provide the rotational position sensing for the stage.

As discussed above, embodiments of the present invention may take into account both rigid body disturbances and wafer distortions. Rigid body disturbances displace the wafer without distorting it. Rigid body disturbances may include disturbances of well-known types that affect lithography and inspection systems. Examples of such rigid body disturbances include, but are not limited to static alignment errors, stage motion non-linearity, thermal deformation of the tool frames, and vibrations. Most, but not all, of such rigid body disturbances may be corrected by the stage, either passively (e.g., through vibration isolation) or actively. For the purpose of defining the SMS requirements for embodiments of the present invention one may assume that the residual errors after stage corrections are on the order of magnitude of the typical linear stages that are currently used in litho tools. There may be a few exceptions to this generalization. For example, the initial alignment capture range may be relatively large. This may be because the chucks on the stage that hold the wafers may have no motion capability and cannot take out wafer placement errors. Furthermore, in some cases there may be no historical data on the rotational stability of the stage. However, from first principles one may assume that the rotational errors will be of extremely low frequency. In addition it may also be desirable to take into account a relatively high frequency disturbance resulting from stage wobble.

There are typically two mechanisms for wafer distortion: mechanical stresses due to the radial forces and a heat load that is deposited by the writing beam. These distortions may cause registration errors that are larger than the residual rigid body disturbances of the stage. Consequently, it is desirable to dynamically sense the wafer distortion. This may be considered a driving requirement for the SMS. The wafer distortion may be 3-dimensional. The SMS may be used to measure the in-plane distortion and focusing sensors may be used to measure distortions of the wafer perpendicular to a nominal wafer plane.

The SMS top level requirements may be based on assumptions about disturbances assumptions and a required registration to a sub-pixel level. Examples of such requirements are listed below for the sake of illustration and are not to be construed as a limitation upon the present invention or any embodiment of the present invention. In the case of a rotating stage, the SMS may be required to acquire a set of alignment targets and establish each wafer position and orientation during the first few revolutions of the stage. The Alignment targets 105 may be typical scanner targets such as are available from ASML, Nikon, and Canon. By way of example, and without limitation, each target 105 may be a box-type target characterized by a characteristic box size L, wherein 20 µm<L<100 µm (box size). By way of example, there may be 4 to 8 per wafer. The sensors 107 may be characterized by a capture range of about 25 µm. Each target may vary from a nominal orientation by up to about ±15 degrees with respect to a nominal orientation. Each sensor may be characterized by a single-look precision of about 0.1 µm and an accuracy of about 0.5 µm. The motion of the targets 105 may vary from about 2 m/s to about 10 m/s. The SMS may be characterized by a measurement time of less than about 5 sec for all wafers on the first stage 102. The SMS may be referenced to fiducial marks on first stage 102.

Once the wafer alignment targets were acquired and the wafers position is known, the SMS may be required to continuously track a large set of targets 105 that are distributed across the wafers. The exact number of targets, their distribution and measurement order may be determined based on a thermal distortion analysis and a control system simulation.

Figure 2A:
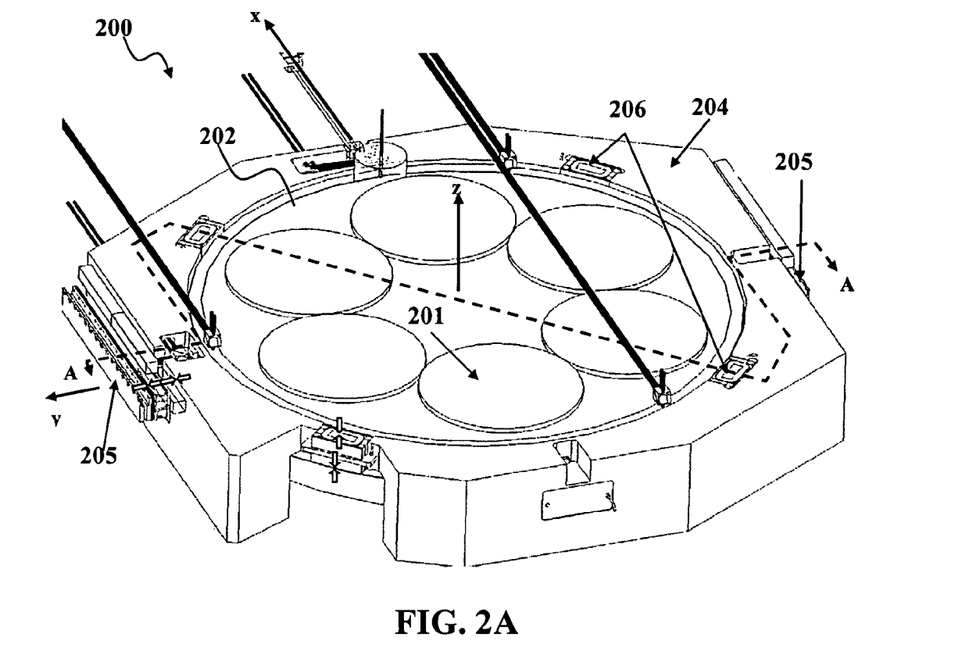
FIG. 2A is a three-dimensional schematic diagram of a rotary-translating stage according to a preferred embodiment of the present invention.
Figure 2B:
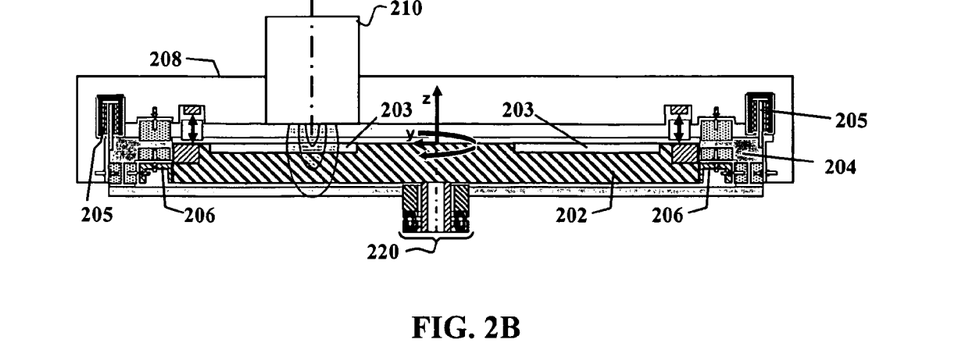
FIG. 2B is a side cross-sectional view of the substrate processing apparatus of FIG. 2A employing the rotary-translating stage taken along line A-A.

By way of example, and without limitation, embodiments may be employed in a substrate processing system that uses a rotary-linear stage. An example of a rotary-linear stage 200 is illustrated in FIGS. 2A-2B. The rotary linear stage 200 may include a rotary stage 202 that is carried by a linear stage 204 using linear motors 205. The rotary stage 202 may support multiple substrate chucks 203 for supporting substrates 201. The rotary stage 202 and its coordinate system defined by axes $x_s$, $y_s$ rotates with rotary speed ω in the direction shown, e.g., under the influence of a rotary motor 220.

The rotary stage 202 may include a peripheral ferromagnetic ring 206. Peripherally mounted rotary stage radial maglev units attached to the intermediate linear stage 204 may apply magnetic forces to the ring 206 along the x and y axes, respectively along lines of force that intersect the rotation axis z. The z axis may be oriented in a substantially vertical direction, a substantially horizontal direction or some other direction between the horizontal and the vertical. Peripherally mounted rotary stage vertical maglev units attached to the intermediate linear stage 204 apply magnetic forces to the ring 206 along the rotation axis z.

The rotary stage 202 spins about its axis of symmetry z and translates along the x axis. The linear stage 204 maintains the rotary stage 202 on a straight path. A following metrology system may close the loop on the position of the rotary stage 202 and the position of an electron beam from the tool 210 relative to the substrates on the chucks 203. Feedback of the position of the rotary stage 202 and substrates 201 may be derived from a number of different sensors. Examples of possible configurations of such sensors are described in detail, e.g., in co-pending U.S. patent application Ser. No. 11/670,896, the entire contents of which are incorporated herein by reference. A heavy and rigid chamber lid 208 may form an inertial frame of reference for the stage metrology. A set of interferometer mirrors may be kinematically attached to the lid 208 to provide a metrology reference frame. Such a configuration may reduce the effect of stage forces on the metrology.

Figure 2C:
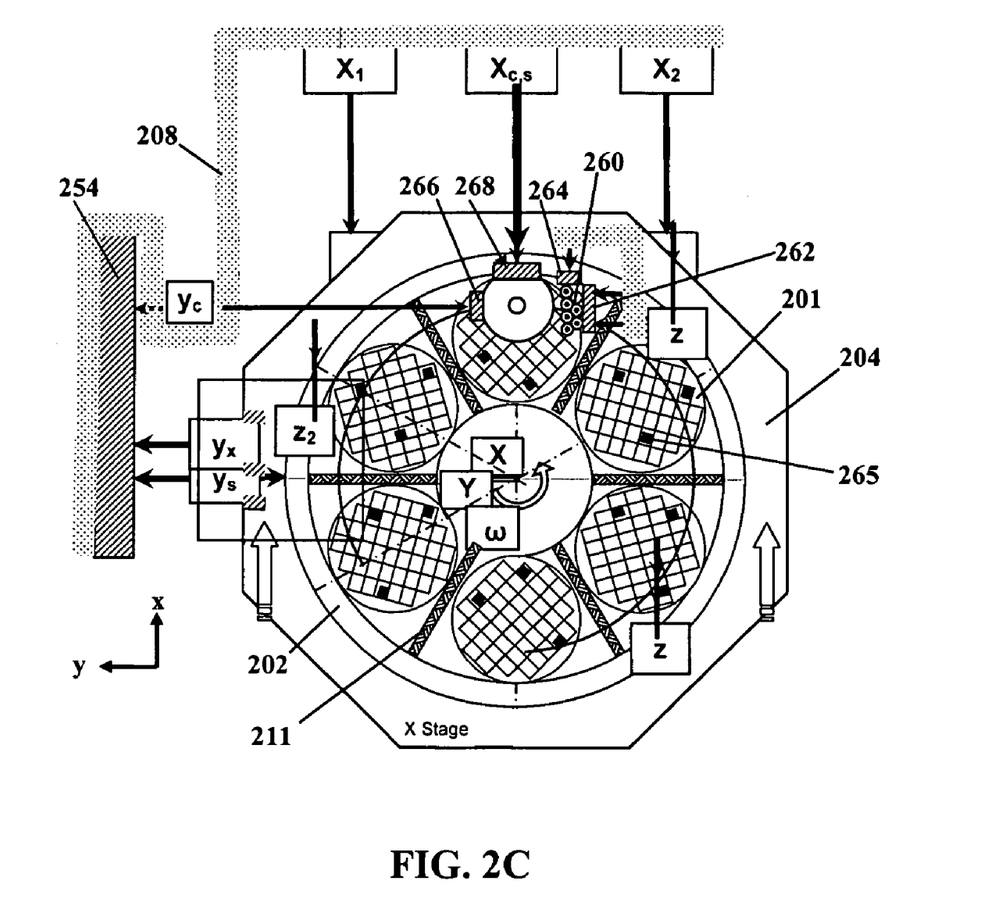
FIG. 2C is a top plan view schematic of a substrate processing apparatus rotary-translating stage according to an embodiment of the present invention showing one possible configuration for servo tracking and metrology.

Any suitable metrology configurations may be used to track dynamic distortions of the substrate in an apparatus of the type described above with respect to FIGS. 2A-2B. By way of example FIG. 2C, illustrates a substrate metrology system (SMS) 260 that uses the chamber lid 208 as a metrology reference frame By way of example the SMS 260 may cover a die-size wide 30 mm swath upstream of an electron beam (e-beam) from the tool 210.

If the locations of the tool 210 and SMS 260 are not stable, they may be tracked using differential measurements and reference mirrors. The SMS cluster may be tracked in x and y directions and yaw angle about the z axis as it focuses on a substrate 201. E-beam to column shifts may also be tracked dynamically. The stage to substrate coordinates may be updated several times on every turn of the rotary stage 202, e.g., using the SMS 260 and e-beam tracking.

Embodiments of the present invention may use differential interferometers to monitor the relative movement of the rotary stage so that a beam from the tool 210 follows a predetermined path P across the substrates 201 retained by the chucks 203. For example, as shown in FIG. 2C an interferometer $Y_s$ may measure the position of the stage relative to a stationary reference system (e.g., with respect to the chamber lid 208) along the y axis. Another differential interferometer $X_{c,s}$ may measure the position of the cylindrical perimeter of the rotary stage 202 relative to the tool 210. The $Y_c$ interferometer differentially measures the location of the tool 210 relative to stationary reference mirror 254 along the y axis using a mirror 266 mounted to the beam column. The $X_{c,s}$ interferometer may similarly track variation in the location of the tool 210 with respect to the x axis using a stationary reference mirror mounted to the chamber lid 208 parallel to the y-z plane and a mirror 268 mounted to the tool 210. The $Y_s$ differential interferometer measures the position of the rotary stage 202 relative to a reference mirror 254. The above-mentioned interferometers may alternatively be implemented in non-differential configurations.

Differential interferometers $Y_s$, $Y_x$ and $Y_c$, which are referenced to a y-reference mirror 262 attached to the chamber lid 208, track the position of the rotary stage 202, X-stage 204 and e-beam column 210, respectively along the y axis. Differential interferometers $Z_1$, $Z_2$, $Z_3$, which are referenced to a mirror mounted to chamber lid, 208 track vertical position, tip and tilt of the rotary stage 202. Interferometers $X_1$, $X_2$, which may be referenced to an x-reference mirror 264 attached to the chamber lid 208, track the position of the X-stage 204 along the x axis and yaw of the X-stage 204 about the z axis.

As seen in FIG. 2C, the rotary stage 202 may include patterned spokes 211 as part of a reference system for tracking the position of the substrates 201 relative to the rotary stage coordinate system with sensors that sense a pattern on the spokes 211. By way of example, the spokes 211 may be visible to the tool 210 or a separate spoke sensor system. Each of the substrates 201 may have multiple alignment targets 265 on its surface to facilitate measurement of distortion of the substrates 201.

Figure 3:
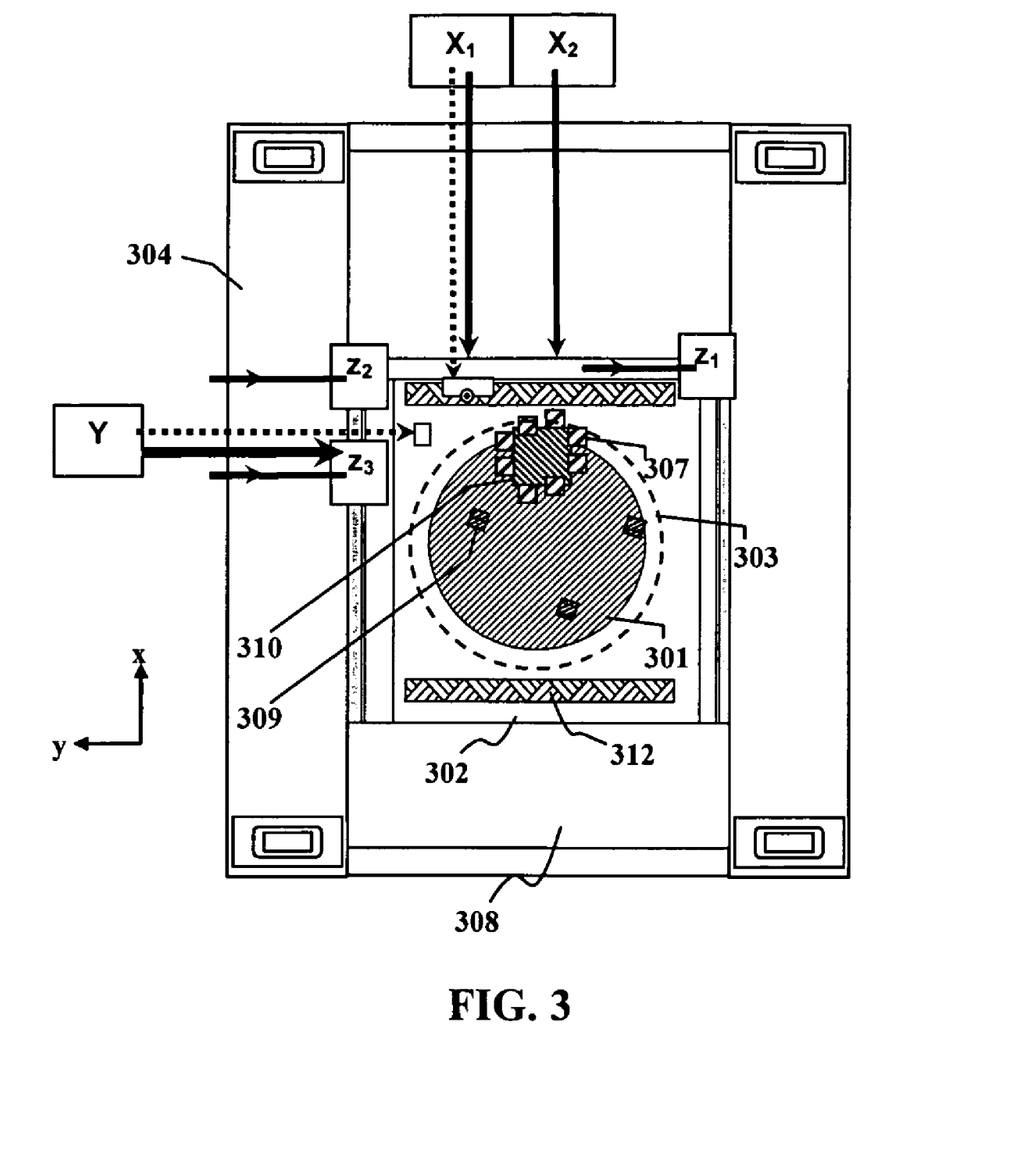
FIG. 3 is a top plan view schematic diagram of an X-Y translating stage according to an embodiment of the present invention.

As noted above, embodiments of the present invention may also be applied to substrate processing with an X-Y stage. For example, FIG. 3 depicts a substrate processing apparatus 300 according to an alternative embodiment of the present invention. The apparatus 300 includes an X-stage 302 and a Y-stage 304. The X-stage 302 includes a chuck 303 adapted to retain a substrate 301 having multiple alignment and registration targets 309 on its surface. Controlled movement of the X-stage 302 along an X-axis relative to the Y-stage 304 may be imparted, e.g., by linear motors 305. The Y-stage 304 may be adapted to move in a Y direction relative to the chamber lid 308, e.g., using linear motors (not shown). The X-stage 302 may move in the X and Y directions relative to a substrate processing tool 310, which may include, e.g., an electron beam column. Sensors 307, which can be of the type depicted in FIG. 1B as describe above, may be stacked to the tool 310.

The apparatus 300 may use one or more interferometers to track the position of various components with respect to a stable reference on the tool frame. These may include an interferometer $X_1$ that measures movement along the x axis of the X-Stage 302 relative to the tool 310. A second interferometer $X_2$ measures movement of the X-stage 302 relative to the reference frame, thereby facilitating measurement of yaw of the X-stage 302. A third interferometer Y measures movement along the y axis of the X-Stage 302 relative to the reference frame and the tool 310. Vertical differential interferometers Z1, Z2, Z3, may be configured to measure changes in position of the top of the X-stage 302 relative to the reference. Although additional interferometers may be used to track the motion of the carriage in the Y-stage 304, this may alternatively be accomplished with the linear motors used to support and/or move the Y-stage 304 along the y direction. Although in this example, the x and y axes are perpendicular to one another, they may alternatively be oriented at some oblique angle.

As seen in FIG. 2C, the X-stage 302 may include patterned features 312 as part of a reference system for tracking the position of the substrate 301 relative to the X-stage. The patterned features 312 may be similar to the patterned spokes 211 shown in FIG. 2C. coordinate system with sensors that sense a pattern on the spokes 211. By way of example, the patterned features 312 may be visible to the tool 310 or a separate pattern sensor system.

Figure 4:
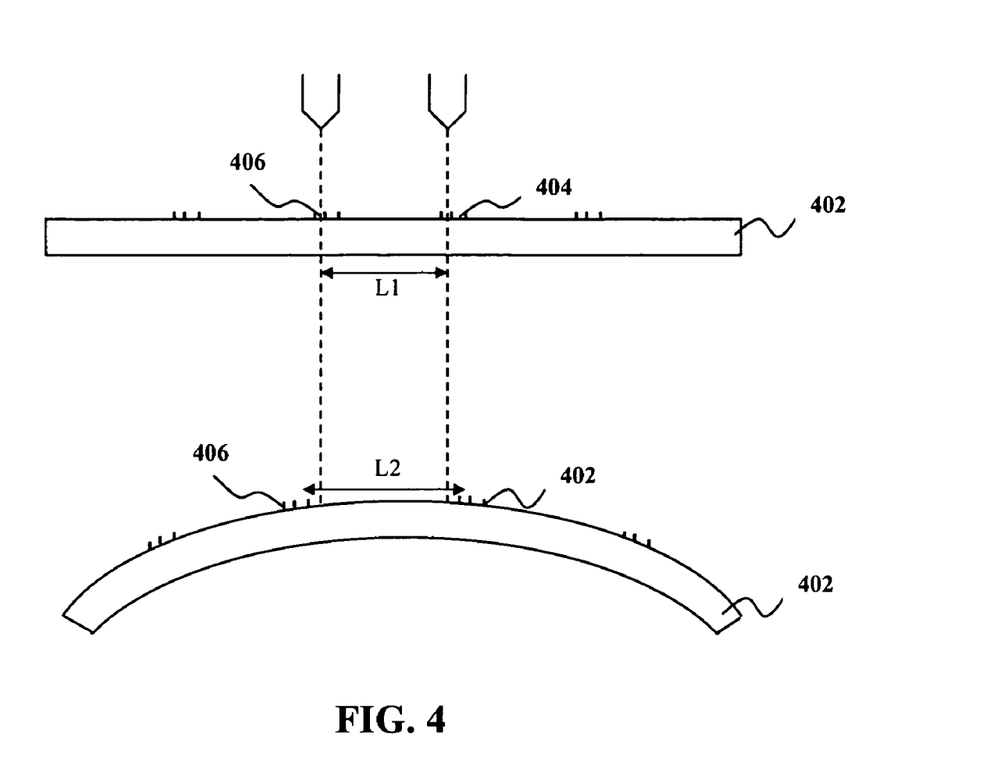
FIG. 4 is a schematic side view diagram of a substrate illustrating determination of substrate deformation from differences in target positions

FIG. 4 is a schematic side view diagram of a substrate illustrating determination of substrate deformation from differences in target positions. As shown in FIG. 4, when a wafer 402 is distorted, the positions of the targets 404 relative to each other will be shifted, e.g., the relative distance L2 between targets 404 of the distorted wafer 403 is different with the relative distance L1 between the targets 404 of the flat wafer 402. Through a process of curve fitting the shape of the wafer between the targets may be determined. The processor may use the curve-fit shape of the wafer to modify the timing, focus, or steering of the beam in order to compensate for the wafer distortion when writing on the substrate with the beam. In this way the pattern written on the wafer may more accurately reflect the desired pattern.

Steering of the beam may be accomplished in a number of ways. For example, in the case of an electron beam, raster plates or magnetic coils may deflect the beam. Alternatively, servo-mechanisms may translate or tilt the beam source.

Figure 5:
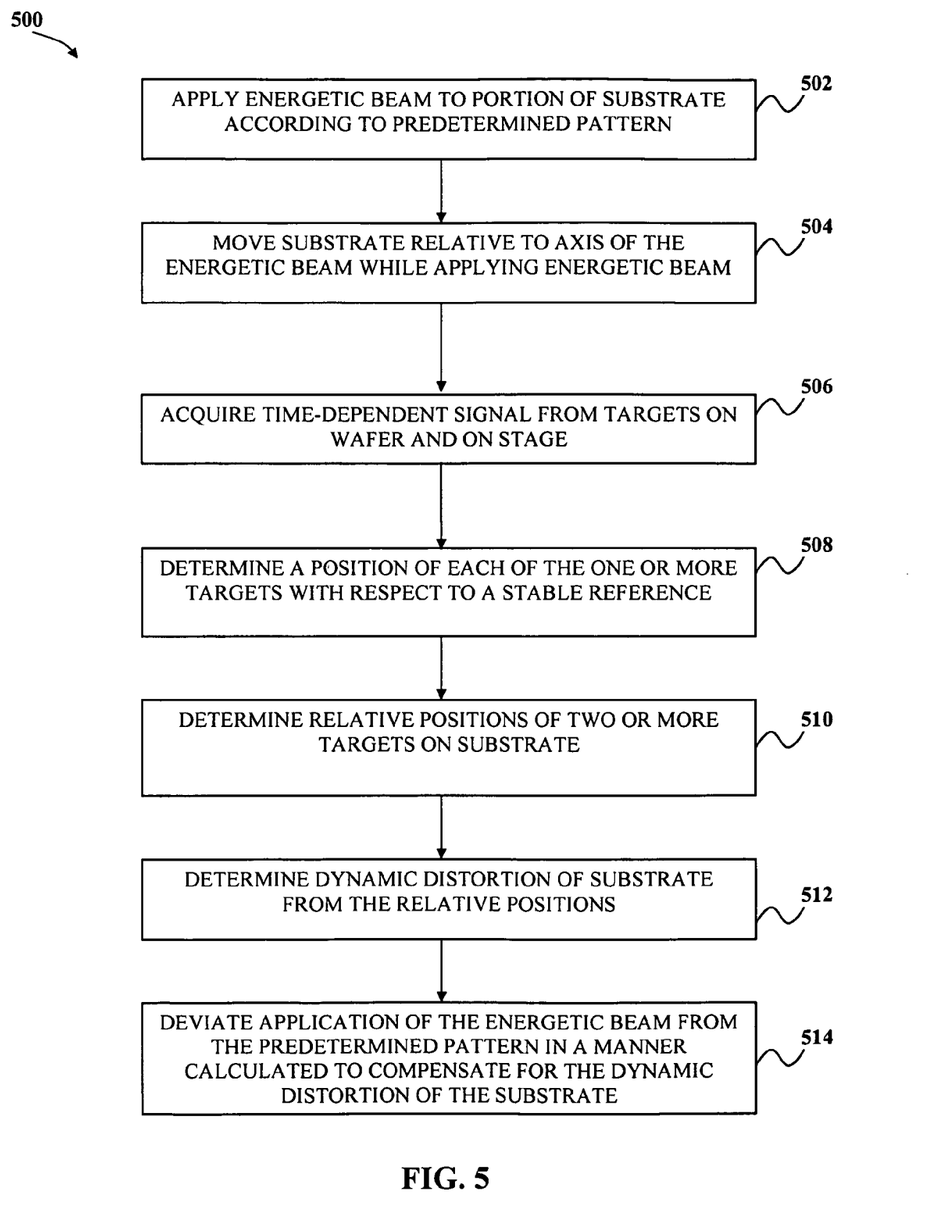
FIG. 5 is a flow diagram illustrating a substrate processing method according to an embodiment of the present invention.

FIG. 5 is a flow diagram illustrating a substrate processing method 500 according to an embodiment of the present invention. An energetic beam is applied to a portion of a substrate according to a predetermined pattern as indicated at 502. For example, focusing radiation through a mask, having a pattern formed thereon, onto the substrate. The substrate may be moved relative to an axis of the energetic beam while applying the energetic beam as indicted at 504. Alternatively, the substrate may be supported with a stage and the stage may be moved relative to an axis of the energetic beam. The substrate can be rotated about an axis perpendicular to a plane of the substrate. Probe radiation may be directed on the substrates, which include multiple metrology targets. A time-dependent signal may be acquired from targets on wafer and on the stage as indicated at 506. By way of example, time-dependent signal radiation generated by interaction between the probe radiation and the metrology targets may be collected and converted into time-dependent electrical signals to generate target measurements signal. The relative time, or phase, between the measurement signals relative to a stable reference may be used to determine positions the targets with respect to a stable reference as indicated at 508. Relative position of one or more targets on the substrate may then be determined by compensating for relative motion of the one or more targets with respect to the stable reference or to the stage as indicated at 510. A dynamic distortion of the substrate is determined from the relative position of the one or more targets as indicated at 512 by tracking a distortion of the substrate over a time scale that is within a band width of the distortion of the substrate. The application of the energetic beam from the predetermined pattern is then deviated in a manner calculated to compensate for the dynamic distortion of the substrate as indicated at 514. Deviating application of the energetic beam may include steering or modulating the energetic beam, adjusting a focus of the radiation, adjusting a relative position between the substrate and the mask, or adjusting imaging of the mask pattern on the substrate with the radiation.

It is noted that embodiments of the present invention may be applied to both direct-write as well as static and scanning photolithography using a mask. It is further noted that beam application may be pulsed. Thus, in the context of a pulsed beam, the phrase "while applying the energetic beam" is defined herein to include intervals of time during a pulse for which the beam is applied as well as periods of idleness between such intervals.

Figure 6:
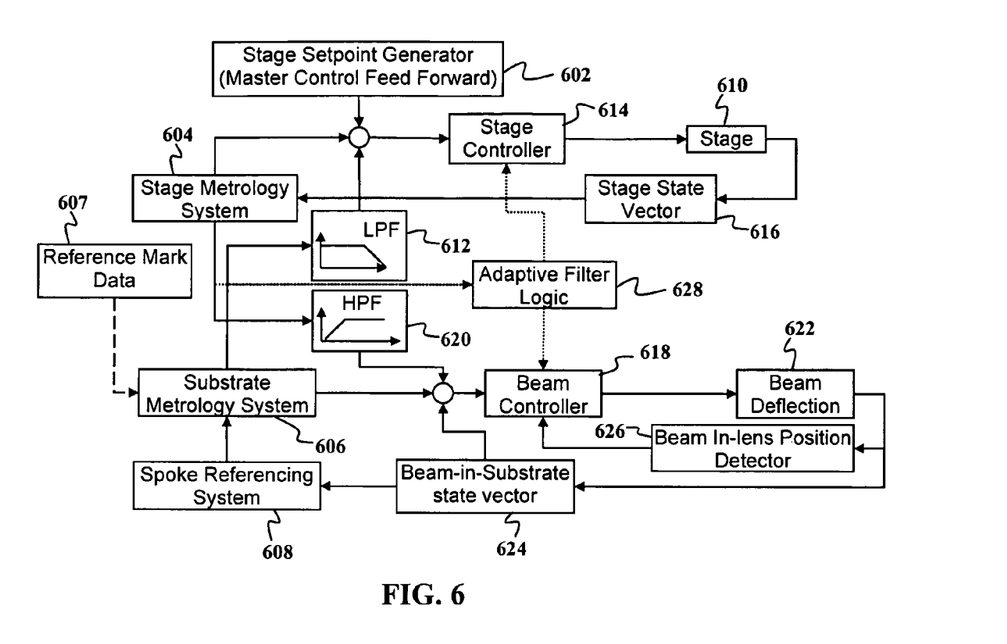
FIG. 6 is a block diagram illustrating an embodiment of a control system that maintains registration of the printed pattern to the features on the wafer.

In FIG. 6 a block diagram of a servo control system for maintaining pattern registration is depicted. A stage Setpoint Generator 602 generates nominal trajectories in linear motion x and rotational motion θ that are used to move and place the substrates with respect to the writing beam. In addition this stage setpoint generator 602 may be used to position the stage for loading, to perform substrate alignment, map the substrate distortions prior to writing, and create a focus map for the optical column and the SMS. In some embodiments, data regarding known topographic features of the substrates may be stored in a database, which may include information regarding the relative orientation of the substrates and their thickness variations. These may be measured as a part of a spin up process and used to generate a correction table to compensate for any misalignments.

The stage setpoint generator 602 may also utilize calibration data that captures thermal and elastic deformation of the rotary stage and/or substrates. For example, the temperature of various components in the system and the resulting distortion due to coefficient of thermal expansion (CTE) differences may be monitored. The distortion values may be pre-computed and stored as a part of the calibration data in the setpoint generator 602. The stage setpoint generator 602 may also include corrections for measured non-uniformities in a given rotary stage. Furthermore, models of the distortion of the rotary stage due to centrifugal forces during spin-up may be stored as a part of calibration data in the setpoint generator 602.

A stage metrology system 604 may perform the r, θ measurements of the rotary stage in addition to the x, y and z interferometer measurements, as described above. The stage metrology system 604 may include multiple redundant sensors and one of the functions represented in this block may include a set of sensor fusion algorithms that provide estimates of the various coordinates of the stage position. The stage metrology system 604 may also contain calibration tables for each of the sensors to compensate for errors that are systematic. For example, harmonic errors in the θ measurements may be measured during a calibration process and stored. These known errors may then be removed from actual measurements before generating estimates of the position of the rotary stage. Similar calibration data is generated and used for the other sensors that are a part of the stage metrology system 604.

An optional Substrate Metrology System (SMS) 606 may provide a measurement between the optical sensors held by the tool frame and the substrate. If the optical sensors are referenced to the writing tool, the SMS 606 may provide an estimate of the position of a substrate relative to the beam from the optical column. These measurements are compared to the reference mark position database 607, generating a control error signal.

The SMS 606 may receive input from a spoke reference system (SRS) 608 that uses spokes of the type described above. The SRS 608 may allow a sensor, e.g., an optical sensor, in the SMS 606 to provide a measurement of the relative position between spokes on the stage and the substrates. The spokes may be features on the rotary stage such as those shown in FIG. 2C. Initial positions of the spokes relative to the substrate position may be stored as a part of the calibration data after loading the substrates.

The measurements from the SMS 606 may be filtered by a low pass filter 612, which may then be combined with inputs from the stage setpoint generator 602 and stage metrology system 604 to produce an error signal that is fed to a stage controller 614. By way of example, the stage controller 614 may be a controller that issues a simultaneous command to all actuators that control the positioning of the rotary stage and linear stage in the stage 610. In the case of the system 200 of FIGS. 2A-2B the controller 614 may adjust the actuation of rotary-stage positioning motors, to drive the error signal to zero.

The command to this stage control loop may have two components. The first component is the reference trajectory command from the stage setpoint generator 602. The second component is a low-pass filtered beam to substrate position error estimate from the low pass filter 612. The stage controller 614 may be used to stabilize the rotary stage and reject imbalance, precession and nutation motion of the rotary stage. In addition, the stage controller 614 may make corrective actions to rectify the low frequency portion of the beam to substrate position error. These corrections may be fed back to the stage metrology system 604 in the form of a stage state vector 616. By way of example, the Stage Metrology System 604 may measure displacements at the interferometer points of incidence, e.g., as described above. Knowing the laser beam configuration relative to the point of reference on the stage, the stage state vector 616 may be calculated. The stage state vector 616 may contain displacements, velocities, accelerations and possibly jerks (derivatives of accelerations with respect to time), in all stage degrees of freedom: e.g., XYZ, pitch, roll, and yaw.

Measurements from the Stage Metrology system 604 SMS 606 and SRS 608 may also be used to estimate a beam to substrate position error. The beam position error may be used to drive a beam controller 618 in such a way as to drive the beam to substrate position error to zero. The beam controller 618 may operate on an error between the commanded beam position and the actual measured beam position and aims to minimize the error. The beam controller 618 receives an input from the stage metrology system 604 that is filtered with a high-pass filter 620. The beam controller 618 also receives an input from the substrate metrology system 606. The combination of these inputs provides a high pass filtered value of a beam-substrate position error estimate.

By way of example the beam controller 618 may produce signals that control a beam deflection mechanism 622 and the actual beam dynamics. The beam deflection mechanism 622 may include electrostatic deflectors or electromagnetic deflectors. The beam deflection control signals may be used to derive a beam-in-substrate state vector 624, which may be combined with measurements of the beam position from the spoke referencing system 608 to produce a measured beam-in-substrate state vector. The measured beam-in-substrate state vector may be used as an input to the beam controller 618.

The beam controller 618 may also obtain input from a beam-in-lens position detector 626 that senses the position of the beam relative to the optical column. The beam-in-lens position detector 626 may sense a position of an optical or electron beam from the optical column relative to an optical axis. The beam-in-lens position detector may also receive input from the beam deflection mechanism 622. In some embodiments, the beam-in-lens position detector 626 may also include a focus sensing scheme.

It may be seen from the preceding discussion that the stage controller 614 and stage 610 provide correction for a low-frequency component of the beam-substrate position error and the beam controller 618 and beam deflection 620 provide correction for a high-frequency component of the beam-substrate position error. The stage controller 614 and beam controller 618 may receive additional input from adaptive filter logic 628 which may be implemented in hardware or in software, e.g., in the form of adaptive control algorithms. By way of example, the adaptive filter logic 628 may use Kalman filtering. The adaptive filter logic 628 may receive input from the stage metrology system 604. There are a number of different possible implementations of the adaptive filter logic 628. For example an imbalance between actuators used to translate the rotary stage in the x direction may cause a variation in the angular speed of the rotary stage. The sensors used in the stage metrology system 604 may sense this imbalance and a differential command may be applied by the stage controller to the x actuators to compensate for the imbalance between the two actuators. Alternatively, reaction forces from controlling the rotary stage may cause motion in the chamber lid. These reaction forces may be adaptively cancelled, e.g., using electrodynamic actuators. In addition, the adaptive filter logic 628 may adaptively correct for effects of thermal and elastic deformation of the rotary stage and/or substrates based on measurements from the substrate metrology system 606 and the spoke referencing system 608 during operation.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A substrate processing method, comprising:
   a) applying an energetic beam to a portion of a substrate according to a predetermined pattern;
   b) determining relative positions of one or more targets on the substrate while applying the energetic beam to the portion of the substrate;
   c) determining a dynamic distortion of the substrate from the relative positions while applying the energetic beam to the portion of the substrate; and
   d) deviating application of the energetic beam from the predetermined pattern in a manner calculated to compensate for the dynamic distortion of the substrate.

2. The method of claim 1, further comprising moving the substrate relative to an axis of the energetic beam while applying the energetic beam according to the predetermined pattern; wherein b) includes determining relative positions of the one or more targets while applying the energetic beam to the substrate and moving the substrate.

3. The method of claim 2, wherein moving the substrate relative to an axis of the energetic beam includes rotating the substrate about an axis perpendicular to a plane of the substrate.

4. The method of claim 2 wherein deviating application of the energetic beam from the predetermined pattern includes steering or modulating the energetic beam.

5. The method of claim 2 wherein determining relative positions of one or more targets includes generating first and second target measurement signals with one or more target sensors and determining a relative phase between the first and second target measurement signals.

6. The method of claim 5, wherein moving the substrate includes supporting the substrate with a stage and moving the stage, the method further comprising determining a position of each of the one or more targets with respect to the stage, wherein determining the relative positions of one or more targets includes compensating for relative motion of the one or more targets with respect to the stage.

7. The method of claim 5, further comprising determining a position of each of the one or more target sensors with respect to a stable reference, wherein determining relative positions of one or more targets includes compensating for relative motion of the one or more target sensors with respect to the stable reference.

8. The method of claim 5 wherein the one or more targets include one or more grating targets.

9. The method of claim 8, wherein the one or more grating targets include a plurality of grating lines oriented at an angle to a scan direction of the energetic beam relative to the substrate.

10. The method of claim 5 wherein generating the first and second target measurement signals includes directing probe radiation to first and second measurement targets; collecting signal radiation generated by interaction between the probe radiation and the first and second targets and converting the signal radiation into first and second time-dependent electrical signals to generate the first and second target measurement signals.

11. The method of claim 1 wherein determining a dynamic distortion of the substrate includes tracking a distortion of the substrate over a time scale that is within a rate of change of the distortion of the substrate.

12. The method of claim 1 wherein applying the energetic beam to the portion of a substrate includes focusing radiation through a mask onto the substrate, wherein the mask has a pattern formed thereon.

13. The method of claim 12 wherein deviating application of the energetic beam from the predetermined pattern includes adjusting a focus of the radiation, adjusting a relative position between the substrate and the mask, or adjusting imaging of the mask pattern on the substrate with the radiation.

14. The method of claim 1 wherein b) includes sensing the wafer targets with a scanning optical microscope.

15. The method of claim 1, further comprising moving the substrate relative to the energetic beam during a), b), c) and d).

16. The method of claim 15 wherein moving the substrate relative to the energetic beam includes applying a scanning motion to the substrate.

17. A substrate processing apparatus, comprising
   a) a beam source configured to apply an energetic beam to a portion of a substrate according to a predetermined pattern;
   b) a target sensor configured to generate time-dependent signals related to positions of one or more targets on the substrate;
   b) a processor operably coupled to the target sensor, the processor being configured to determine a relative position of the one or more targets from the time-dependent signals on the substrate while the beam source applies the energetic beam to the portion of the substrate;
   c) a processor further configured to determine a dynamic distortion of the substrate from the relative positions while the beam source applies the energetic beam to the portion of the substrate; and
   d) a beam controller operably coupled to the processor and the beam source, the beam controller being configured to deviate application of the energetic beam from the predetermined pattern in a manner calculated to compensate for the dynamic distortion of the substrate.

18. The apparatus of claim 17, further comprising a stage adapted to move the substrate while applying the radiation with the beam source.

19. The apparatus of claim 18 wherein the stage is configured to rotate the substrate about an axis perpendicular to a plane of the substrate.

20. The apparatus of claim 18 wherein beam controller and beam source are configured to deviate the energetic beam from the predetermined pattern by steering or modulating the energetic beam.

21. The apparatus of claim 18 wherein the target sensor is configured to generate first and second time-dependent target measurement signals based on positions of one or more targets on the substrate and wherein the target sensor is configured to determine relative positions of the one or more targets by determining a relative phase between the first and second time-dependent target measurement signals.

22. The apparatus of claim 18, wherein the stage includes a reference target, wherein the target sensor and processor are configured to determine a position of the reference target and wherein the processor is configured to compensate for relative motion of the one or more targets with respect to the reference target, when determining the relative positions of one or more targets.

23. The apparatus of claim 18 wherein the beam source is an electron beam source.

24. The apparatus of claim 18 wherein the target sensor and processor are configured to track a distortion of the substrate over a time scale that is within a rate of change of the distortion of the substrate.

25. The apparatus of claim 18 wherein the beam source is an electron beam source and the energetic beam is an electron beam.

26. The apparatus of claim 25 wherein beam controller and beam source are configured to deviate the energetic beam from the predetermined pattern by steering or modulating the energetic beam.

27. The apparatus of claim 17, wherein the beam source is configured to applying the energetic beam to the portion of a substrate by focusing radiation through a mask onto the substrate.

28. The apparatus of claim 27, further comprising adaptive optics disposed between the beam source and the substrate and operably coupled to the processor to adjust imaging of a mask pattern on the substrate with the radiation.

\* \* \* \* \*